Oct. 9, 1951 A. B. MACNEE 2,571,045

AMPLIFIER COUPLING CIRCUIT

Filed Aug. 8, 1945

*INVENTOR.*
ALAN B. MACNEE
*BY*
William D. Hall,
*ATTORNEY*

Patented Oct. 9, 1951 2,571,045

UNITED STATES PATENT OFFICE 2,571,045

AMPLIFIER COUPLING CIRCUIT

Alan B. Macnee, Boston, Mass., assignor, by mesne assignments, to the United States of America as represented by the Secretary of War Application August 8, 1945, Serial No. 609,655

7 Claims. (Cl. 179—171)

This invention relates to radio-frequency amplifiers and more particularly to interstage coupling circuits therefor.

In the design of high gain receivers an important consideration is the noise which is introduced in the various stages of amplification and especially in the first two or three stages. The amount of noise which is introduced in a stage of amplification is commonly designated by giving the noise figure of the stage. "Noise figure" may be defined as the noise power in any stage referred to the input divided by the theoretical minimum noise power.

A further consideration in receiver design, especially when used in short pulse work such as in radar or radio object-locating equipment, is the bandwidth. For example, if the received pulses are about one microsecond in duration, the receiver bandwidth may be as wide as 3 to 4 megacycles. It will be obvious to those skilled in the art that since increasing bandwith increases noise obtaining wide bandwidth and low noise figure are contradictory efforts.

It can be shown that a triode amplifier stage introduces less noise than pentode or other type stages. More satisfactory results can further be obtained by using grounded-grid triodes and applying the signals to be amplified to the cathodes of such tubes. Such a circuit reduces feedback and has less tendency toward undesired oscillations than more conventional triode circuits. In the case of a typical triode such as the 6J4, if a curve of noise figure versus impedance of the driving source as seen from the cathode of the amplifier tube is plotted, a noticeable minimum will be found when the source impedance is in the vicinity of 700 to 800 ohms. The output impedance, i. e., impedance seen looking into the plate of the amplifier tube will be 35,000 to 40,000 ohms when the source impedance as seen from the cathode is 700 to 800 ohms. If conventional coupling, such as capacitor-resistor coupling with a resonant shunt inductor, is used between the plate of this amplifier and the next stage, the noise figure will be too high if the second stage is a triode stage, and the bandwidth will be too narrow if the second stage is a pentode stage. If a regular inductance type impedance transformer is used, proper matching cannot be obtained, and furthermore such transformers do not behave in the desired manner for impedance above a few hundred ohms.

It is an object of the present invention, therefore, to provide a novel coupling circuit for use between two grounded-grid amplifier stages.

It is a further object of the present invention to provide a novel coupling circuit which may be used between a source and a load for matching purposes.

Figure 1:
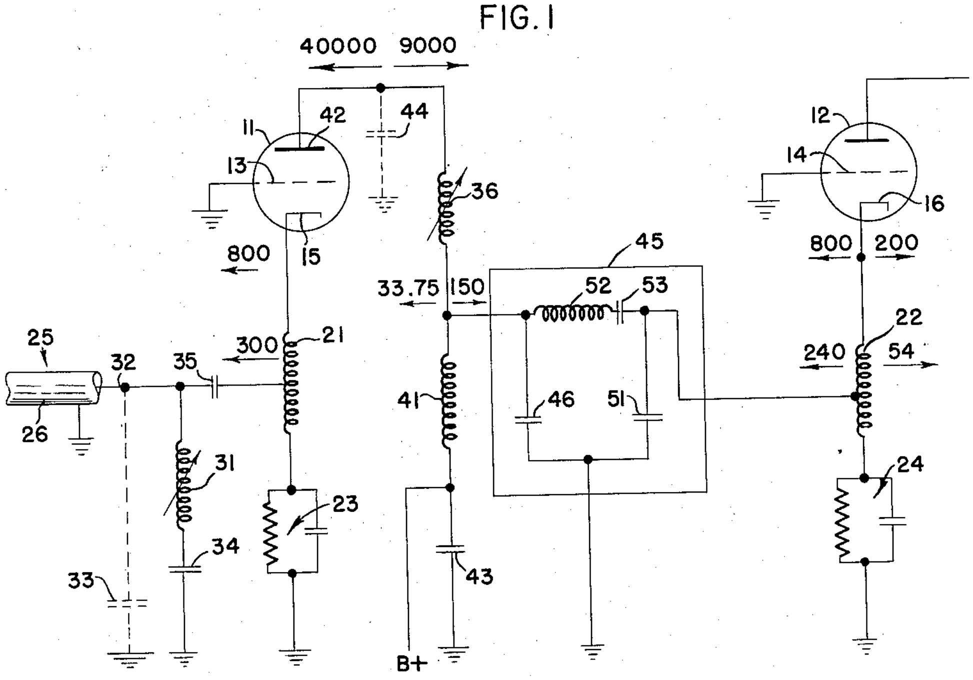
Figure 2:
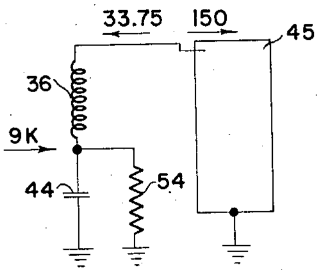

For a better understanding of the invention, together with other and further objects thereof, reference is had to the following description taken in connection with the accompanying drawing in which:

Fig. 1 is a wiring diagram of a portion of a receiver which might be used in a radio object-locating system, showing two grounded-grid amplifier stages coupled together in a manner consistent with the present invention; and Fig. 2 shows a circuit equivalent to one portion of the circuit of Fig. 1.

Referring now to the drawing and more particularly to Fig. 1 thereof, there is shown an embodiment in which the present invention is utilized for coupling between two intermediate-frequency amplifier stages. The circuit as shown comprises triodes 11 and 12, the control grids 13 and 14 respectively of which are grounded. The cathodes 15 and 16 are returned respectively to ground through coils or autotransformers 21 and 22 and cathode biasing networks 23 and 24. A signal input is provided from a coaxial line 25, the outer conductor 26 of which is grounded. A variable inductor 31, connected to the inner conductor 32 of line 25, is adjusted to resonate at the intermediate frequency with the distributed capacitance represented by capacitor 33 shown in dotted lines. Capacitor 34, in series with inductor 31, provides a radio-frequency short to ground. The high-potential side of inductor 31, or conductor 32, is connected through a coupling capacitor 35 to a tap on autotransformer 21 in the cathode circuit of tube 11.

A variable inductor 36 in series with a radio-frequency choke 41 connect anode 42 of tube 11 to a suitable source of positive potential labeled B+. The choke 41 is self-resonant at the intermediate frequency. A suitable by-pass capacitor 43 connects B+ to ground for radio frequencies. The output capacitance of tube 11, which includes anode-to-grid capacitance and wiring capacitance, is represented by capacitor 44 shown in dotted lines. A network 45 which artificially simulates a quarter wavelength section of transmission line connects the juncture of inductor 36 and choke 41 to a tap on autotransformer 22 in the cathode circuit of tube 12. The network 45 is schematically shown as comprising a "pi" network having shunt capacitors 46 and 51 and series inductor and capacitor 52 and 53 respectively. The capacitor 53 is provided primarily for isolating purposes and has substantially zero impedance at the radio frequencies.

At various points in Fig. 1 there are shown horizontal arrows pointing to the left and to the right and having numbers above them. A number having an arrow beneath it pointing to the left indicates the impedance seen at the particular point indicated looking toward the signal source. A number having an arrow beneath it pointing to the right indicates the impedance seen looking toward the load from that particular point. The numbers used are representative when a 6J4 grounded grid amplifier stage is used and when the respective impedances are measured or determined at the mid-frequency of the band of frequencies which the amplifier is designed to pass. However, it will be understood that they are exemplary only, and the invention herein disclosed is obviously not limited to applications wherein these values are used.

As has been stated before, the source impedance as seen from the cathode of the grounded grid tube should be from 700 to 800 ohms. The first amplifier, in the case shown in Fig. 1, tube 11, is usually fed from a crystal mixer. The impedance of the crystal is normally about 300 ohms. This impedance is indicated by the arrow labeled 300 near the tap on autotransformer 21. This impedance, 300 ohms, is transformed by means of the autotransformer 21 in a manner well understood in the art so that at the cathode 15 of tube 11 the source impedance is 800 ohms as indicated by the arrow labeled 800. The source impedance, which will be seen at the anode 42 of tube 11, is approximately "mu" times the source impedance seen at the cathode, "mu" being the amplification factor of the tube, and being equal to 50. The source impedance at the anode 42 is then about 40,000 ohms as indicated. As before stated, this impedance must be altered for best noise figure and bandwidth considerations. The inductor 36 is adjusted so that series resonance is produced between inductor 36 and capacitor 44. In Fig. 2 this part of the circuit is reproduced. It will be noted that a resistor 54 is in parallel with the capacitor 44. The resistor 54 represents the resistance of 40,000 ohms which is seen at the anode 42 of the tube 11. The choke 41, which is self-resonant at the intermediate frequency, produces an effective open circuit from its high end to ground and so, therefore, does not enter into the equivalent circuit of Fig. 2. The source impedance seen when looking from the junction of inductor 36 and choke 41 will have a value of about 33.75 ohms. This value is given by the expression, (2) $$R=\frac{X^2}{R_{54}}$$

where X is the reactance of the inductor 36 or the capacitor 44 at resonance and $R_{54}$ is the resistance of resistor 54. This low impedance of about 33.75 ohms is now transformed by means of the network 45. It is a property of quarter wavelength transmission lines, of which network 45 is an equivalent, that (3) $$Z_c^2=Z_{in}.Z_{out}$$

where $Z_c$ is the characteristic impedance of the line, $Z_{in}$ is the impedance seen looking in one end and $Z_{out}$ is the impedance terminating the opposite end. The network 45 is so designed that the source impedance seen at the tap on autotransformer 22 in the cathode circuit of tube 12 is 240 ohms instead of the 33.75 ohms which terminates it at the opposite end. The source impedance of 240 ohms at the tap on autotransformer 22 is transformed to 800 ohms source impedance at the cathode 16 of tube 12. Proper transformation has thus been made to produce optimum results insofar as noise figure is concerned.

The problem of bandwidth will now be considered. The load impedance seen at the cathode 16 of tube 12 is approximately 200 ohms. This load impedance is transformed so that at the tap on autotransformer 22 the load impedance is about 54 ohms. This impedance now terminates the network 45 and the load impedance seen at the juncture of inductor 36 and choke 41 is approximately 150 ohms. The transformation may be calculated by the use of equation 3. It should be noted that the network 45 has acted as a step-up transformer in both directions since $Z_c$ is greater than either $Z_{in}$ or $Z_{out}$, whereas conventional transformers step up in one direction only. Noting now Fig. 2, it is seen how the load impedance of 150 ohms is in parallel with the aforementioned series resonant circuit. Thus, the load impedance seen by the tube 11 at its anode 42 is approximately 9000 ohms. This value of 9000 ohms has been found to be a value which will give a bandwidth of 3 to 4 megacycles using the 6J4 tube which has been herein taken as a typical tube for this use. It is apparent that the present invention may be designed for any desired impedance transformation in either direction and that any desired bandwidth within reason may be obtained.

While there has been described what is at present considered the preferred embodiment of the invention, it will be obvious to those skilled in the art that various changes and modifications may be made therein without departing from the invention.

What is claimed is:

1. In combination with a first and a second grounded-grid amplifier for operation within a predetermined band of frequencies and a suitable voltage source therefor, a coupling circuit comprising an inductor that is series-resonant with the output capacitance of the first amplifier, parallel-resonant means for connecting one end of said inductor to the voltage source, and a network adapted to simulate a quarter wavelength transmission line at said frequencies and having input and output terminals, said input terminal being connected to said one end of said inductor and said output terminal being suitably connected to the input to second amplifier, said network having a characteristic impedance that is greater than the impedances of the elements connected to its terminals, whereby proper impedance transformations may be made to produce minimum noise and optimum bandwidth under operating conditions.

2. In combination with first and second amplifiers for operation within a predetermined band of frequencies, a circuit for coupling an input signal through said first and second amplifiers with optimum gain and bandwidth and minimum noise, including a series resonant circuit coupled to said first amplifier, for providing a low impedance load for said first amplifier, and a network simulating a quarter wavelength transmission line at said frequencies and coupled to said series circuit at one end and to the input of said second amplifier at the other end, said network having a characteristic impedance that is greater than the impedances of the elements coupled to its ends, said network serving to transform the low impedance load of said first amplifier into a higher impedance that is a suitable input impedance for said second amplifier, thereby producing minimum noise, and said network also serving to transform the low impedance presented to it by said second amplifier into a higher impedance which is presented as an additional load for said first amplifier, thereby producing optimum gain of a wide bandwidth.

3. A circuit as set forth in claim 2, wherein said first and second amplifiers are triode vacuum tubes with grounded grids.

4. A circuit as set forth in claim 3, wherein said series resonant circuit comprises a variable inductor connected at one end to the plate of said first triode amplifier and at the other end to said network, forming a resonant circuit with the output capacitance of said first triode amplifier.

5. A circuit as set forth in claim 4 and also including a parallel resonant circuit connected between said other end of said variable inductor and a source of positive potential, thereby acting as a high impedance block to alternating currents developed across the load of said first triode amplifier.

6. A circuit as set forth in claim 5, and also including a first transformer connected in the cathode circuit of said first triode amplifier, for transforming the input impedance to said first triode amplifier to a value producing minimum noise, and a second transformer connected in the cathode circuit of said second triode amplifier and coupled to said network, for transforming the impedance presented by said network into one producing minimum noise.

7. In combination with first and second amplifiers for operation within a predetermined band of frequencies, a circuit for coupling an input signal through said first and second amplifiers with optimum gain and bandwidth and minimum noise, including a first low impedance circuit in the output circuit of said first amplifier, a second low impedance circuit coupled to the input terminal of said second amplifier, a network simulating a quarter wavelength transmission line at said frequencies, said first low impedance circuit being coupled to said network at one end thereof and said second low impedance circuit coupled through said input terminal of said second amplifier to said network at the other end thereof, said network having a characteristic impedance that is greater than the impedances presented to the network by the elements coupled to its ends, said network serving to transform said first low impedance circuit into a first higher impedance that is a suitable input impedance for said second amplifier, said network also serving to transform said second low impedance circuit into a second higher impedance that is presented as an additional load for said first amplifier, said first low impedance circuit being smaller than said second low impedance circuit and said first higher impedance being greater than said second higher impedance, whereby said circuit will amplify said signal with a high gain, a wide bandwidth, and a minimum of noise.

ALAN B. MACNEE.

REFERENCES CITED

The following references are of record in the file of this patent:

UNITED STATES PATENTS

| Number | Name | Date |
|---|---|---|
| 2,018,320 | Roberts | Oct. 22, 1935 |
| 2,084,475 | Braden | June 22, 1937 |
| 2,153,776 | Roberts | Apr. 11, 1939 |
| 2,229,812 | Maitland | Jan. 28, 1941 |
| 2,278,251 | Dome | Mar. 31, 1942 |
| 2,281,621 | Rust | May 5, 1942 |
| 2,393,709 | Romander | Jan. 29, 1946 |
| 2,463,229 | Wheeler | Mar. 1, 1949 |